United States Patent [19]

Horner et al.

[11] Patent Number: 5,057,171
[45] Date of Patent: Oct. 15, 1991

[54] ISOSTATIC PRESS FOR LAMINATING MULTI-LAYER COMPONENTS AND METHOD OF LAMINATION

[75] Inventors: James W. Horner; Gordon O. Zablotny, both of San Diego, Calif.

[73] Assignee: Pacific Trinetics Corporation, San Marcos, Calif.

[21] Appl. No.: 515,056

[22] Filed: Apr. 26, 1990

[51] Int. Cl.$^5$ .............................................. C04B 37/00
[52] U.S. Cl. ...................................... 156/89; 425/151; 425/161; 425/405.2; 100/299
[58] Field of Search ................... 425/405.1, 405.2, 151, 425/161; 419/42, 68; 100/299 X; 156/89

[56] References Cited

U.S. PATENT DOCUMENTS

| | | | |
|---|---|---|---|
| 2,648,125 | 8/1953 | McKenna et al. | 425/405.2 |
| 2,803,852 | 8/1957 | Cook | 425/161 |
| 3,091,804 | 6/1963 | Gerard et al. | 425/405.2 |
| 3,093,862 | 6/1963 | Gerard et al. | 425/405.2 |
| 3,313,871 | 4/1967 | Vogel et al. | 419/68 |
| 3,319,292 | 5/1967 | Witkin | 425/405.2 |
| 4,063,941 | 12/1977 | Papen | 425/405.2 |
| 4,217,087 | 8/1980 | Bowles | 425/405.2 |
| 4,395,219 | 7/1983 | Franken et al. | 425/405.2 |
| 4,563,143 | 1/1986 | Pettersson | 425/405.2 |
| 4,580,965 | 4/1986 | Wernecke | 425/151 |

OTHER PUBLICATIONS

Fluitron Inc., "Cold Isostatic Pressing", Bulletin 8.1; and Pressure Equipment for Laboratory-Pilot Plant--Plant Bulletin 9.1 (1979).
IPS Inc., "Cold Isostatic Presses"; Hot Isostatic Presses; Eagle-CIP; Eagle 6; Eagle 9; and Eagle 12 product literature (Exact Date Unknown).

Primary Examiner—Edward K. Look
Assistant Examiner—F. Daniel Lopez
Attorney, Agent, or Firm—Brown, Martin, Haller & McClain

[57] ABSTRACT

A pressure chamber apparatus comprises a pressure chamber having an opening at one end and a plug member with a self locking sealing design telescopically mounted in the chamber for sliding movement between a retracted position in which it is inside the chamber and an extended position in which it projects at least partially out of the chamber opening. The plug member has a transverse through slot for containing one or more workpieces to be pressurized, and substantially fills the pressure chamber in the retracted position. The slot in the plug member and the pressure chamber surrounding the plug member are filled with liquid, and connected to a pressure booster for pressurizing the liquid to a selected level.

11 Claims, 5 Drawing Sheets

ISOSTATIC PRESS FOR LAMINATING MULTI-LAYER COMPONENTS AND METHOD OF LAMINATION

BACKGROUND OF THE INVENTION

The present invention relates generally to a pressure chamber apparatus and a system or method for compressing workpieces in such an apparatus, and is particularly concerned with a lamination system and method for laminating multi-layer ceramic components.

Pressure can be applied to workpieces by compressing them between opposing metal platens in a press or by placing them in a pressure vessel or chamber. One application of such techniques is in laminating multi-layer ceramic components.

Multi-layer electronic components are typically formed from several layers of ceramic material which are covered with the appropriate printed patterns to form the desired electronic circuit. The layers are first treated to provide a desired pattern of holes of various shapes and sizes, which are then filled with conductive ink or paste. The filled holes are interconnected via an interconnect pattern of conductive ink printed on each layer. The layers are then collated and stacked in precise alignment. The collated stack must then be laminated into a monolithic form through the application of pressure and heat. Under proper conditions, the plastic binder materials soften and flow sufficiently to bond.

If lamination is done by compressing the stacks between opposed heated platens, any cavities in the end product must be filled with a tightly fitting plug or a complex die face must be used. Also, the individual sheets must be cut precisely to uniform dimensions in the blanking process when this technique is used. Another problem with this technique is the difficulty of ensuring even application of pressure over the face of the press.

Where the parts are laminated in a pressure chamber filled with heated water under pressure, other problems arise. In view of the high pressures needed to achieve lamination, typically of the order of 5000 p.s.i., the lid of the pressure chamber is subjected to extremely high forces, equivalent to its area multiplied by the pressure in the chamber, and these forces are all in the same direction, i.e. out of the chamber. It is therefore difficult to provide sufficiently strong closure clamps to restrict movement of a lid subjected to around a million pounds of force, and to adequately seal the chamber under such conditions. This makes the apparatus relatively expensive and also difficult to use. The complex clamps take some time to lock prior to lamination and to release after lamination is completed, so that loading of components and subsequent removal and replacement with a load of new components is a lengthy and tedious procedure. Also, since the pressure chamber is open to the atmosphere at the end of each lamination cycle, air can enter the chamber and must be purged prior to pressurization.

SUMMARY OF THE INVENTION

It is an object of this invention to provide an improved pressure chamber apparatus and system.

According to one aspect of the present invention, a pressure chamber apparatus is provided which comprises an outer housing having an internal chamber, the chamber having an opening at one end, and a plug member telescopically mounted in the chamber, the plug member being moveable between a retracted position in which it substantially fills the chamber and an extended position in which it projects out of the chamber opening. A suitable drive mechanism is provided for driving the plug member back and forth between its two positions. The plug member has a transverse through slot or cavity at an intermediate position in its length dimensioned to receive one or more components to be treated in the pressure chamber, and the slot is positioned outside the chamber when the plug member is in its extended position. A means for pressurizing liquid such as water in the chamber is connected to the chamber.

End seals are provided on the outermost ends of the plug member to seal the chamber when the plug member is retracted. Preferably, an end cap is secured to both ends of the plug with a sealing assembly clamped between each end cap and plug end. Since the area of the seals exposed to the pressurized liquid in the chamber is relatively small, and the outward force acts equally in opposite directions on the exposed areas of the opposite end caps, there will be no net force tending to urge the plug out of the chamber. The force applied by the liquid filling the slot in the plug member on the walls of the slot is also directed equally in all directions, and the plug member is made sufficiently massive to withstand such forces.

Preferably the slot or cavity is elongate with its longitudinal axis aligned with the axis of the plug member, and has rounded or radiused ends to spread the forces more evenly in all directions. The seal assembly preferably comprises an annular plug member having tapered sides, so that it will tend to spread and provide a greater sealing effect as the force on it is increased.

In the preferred embodiment of the invention, the apparatus includes an outer reservoir in which the internal chamber is contained, the outer reservoir containing liquid to a level above the chamber opening. Since the chamber itself is always under water, there is no need to purge air from the chamber after each lamination cycle. The reservoir is connected to a pressure input to the internal chamber via a suitable pressure booster for pumping liquid from the reservoir into the internal chamber until a desired pressure is reached.

According to another aspect of the invention, a method of applying pressure to a workpiece is provided, which comprises placing the workpiece in a transverse through slot in a plug member, lowering the plug member into a pressure chamber until it substantially fills the chamber, sealing the chamber, supplying liquid under pressure to the chamber until a predetermined pressure is reached, maintaining the pressure for a predetermined time period, releasing the pressure, and raising the plug member to an elevated position in which the slot is outside the chamber to allow removal of the treated workpiece.

Preferably, the workpiece is in the form of a multi-layer ceramic component which is vacuum sealed in an outer bag before placing into the plug slot. A plurality of workpieces may be laminated simultaneously, and a suitable rack which slides in and out of the slot for carrying the workpieces is provided.

DESCRIPTION OF THE DRAWINGS

The present invention will be better understood from the following detailed description of a preferred embodiment, taken in conjunction with the accompanying drawings, in which like reference numerals refer to like parts, and in which.

DESCRIPTION OF THE PREFERRED EMBODIMENT

Figure 1:
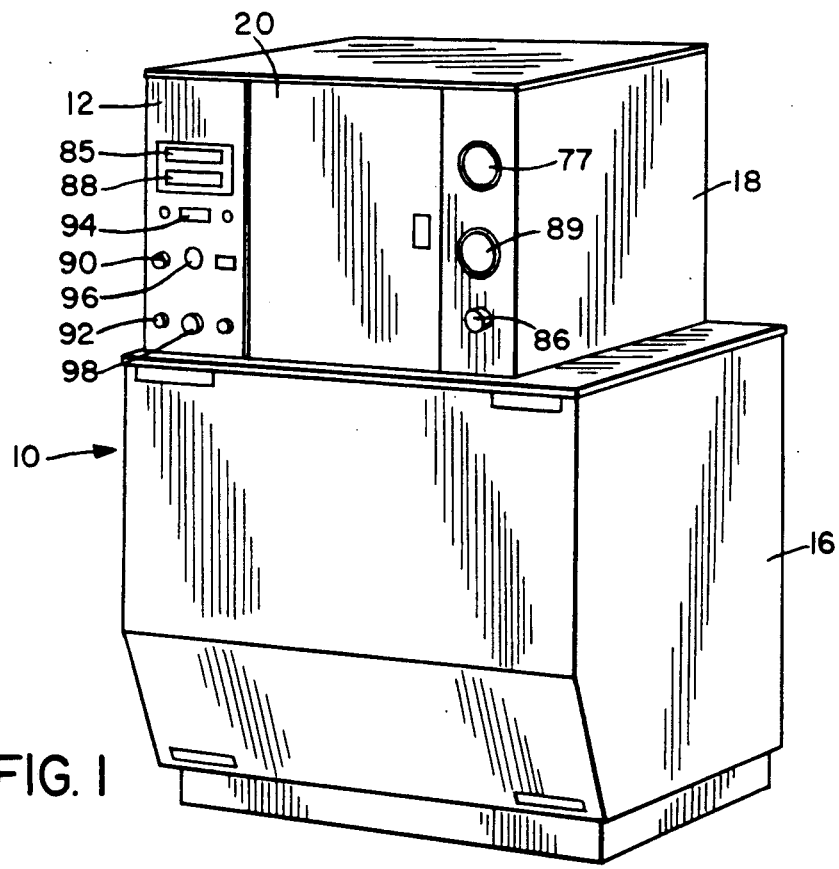
FIG. 1 is a perspective of pressure chamber apparatus according to a preferred embodiment of the invention.

The drawings illustrate a pressure chamber apparatus and system for compressing one or more workpieces. In the preferred embodiment of the invention, the apparatus comprises an isostatic lamination system for laminating multi-layer electronic components. However, it may be used in any application where high pressure is to be applied evenly over the surface of a workpiece.

The apparatus is mounted within a suitable outer cabinet or enclosure 10 having a control panel 12 on its front wall for operator control of the apparatus. The housing or cabinet 10 includes a lower chamber or section 16 and an upper chamber or section 18 having an access door 20 for operator access for insertion and removal of workpieces. Access door 20 is locked automatically during each pressurization cycle, as will be explained in more detail below.

Figure 4:
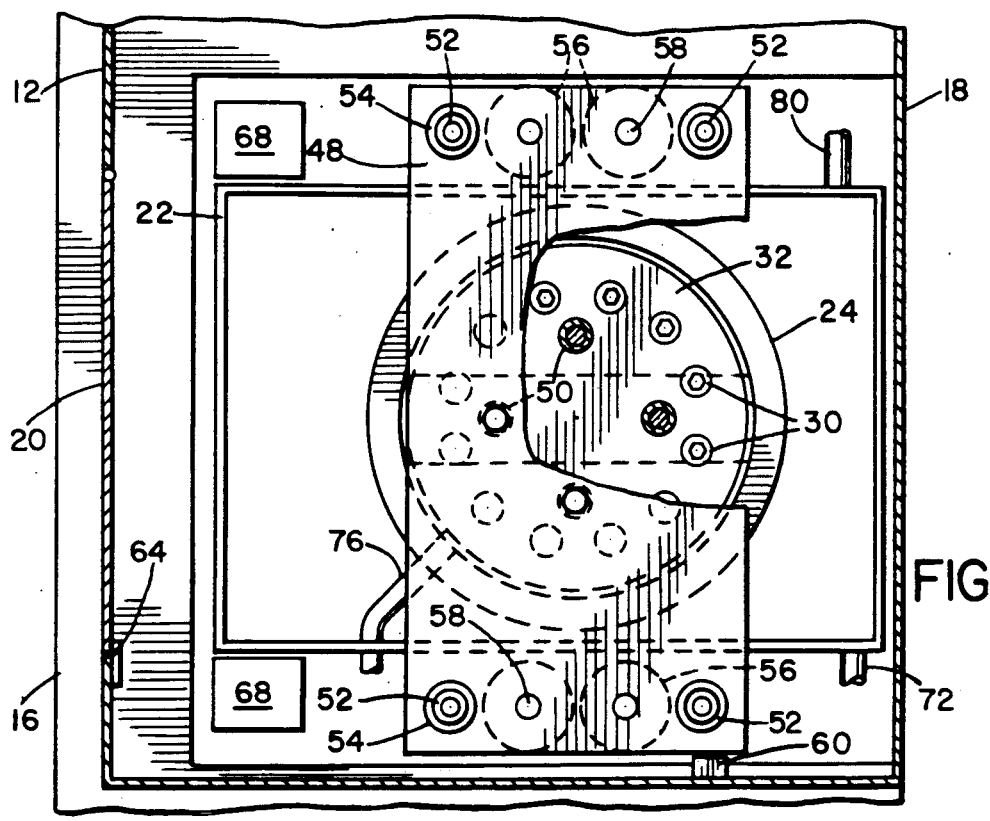
FIG. 4 is a top plan view of the pressure chamber and reservoir.
Figure 2:
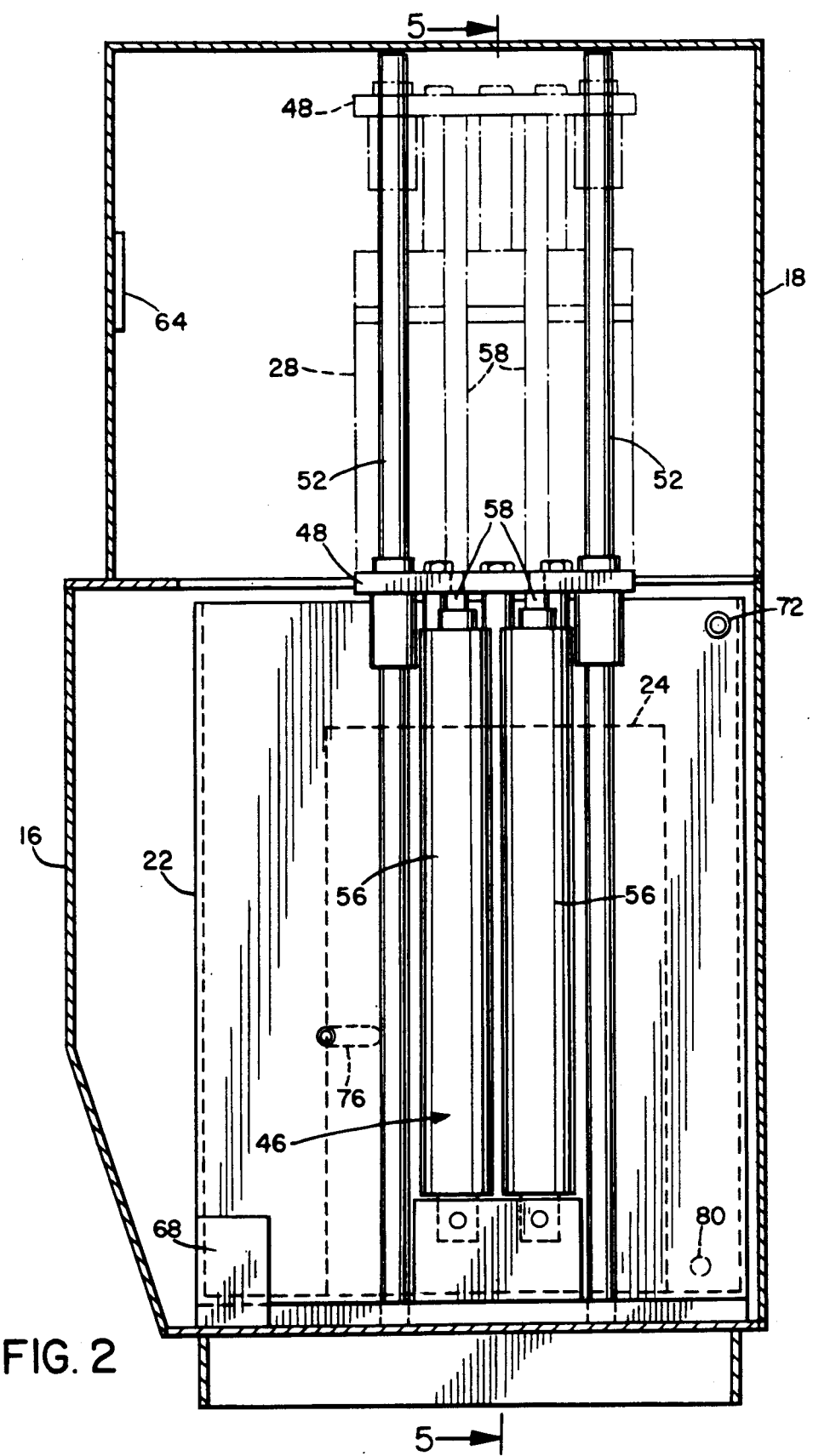
FIG. 2 is a side elevational view of the apparatus, with the cabinet panels removed.
Figure 3:
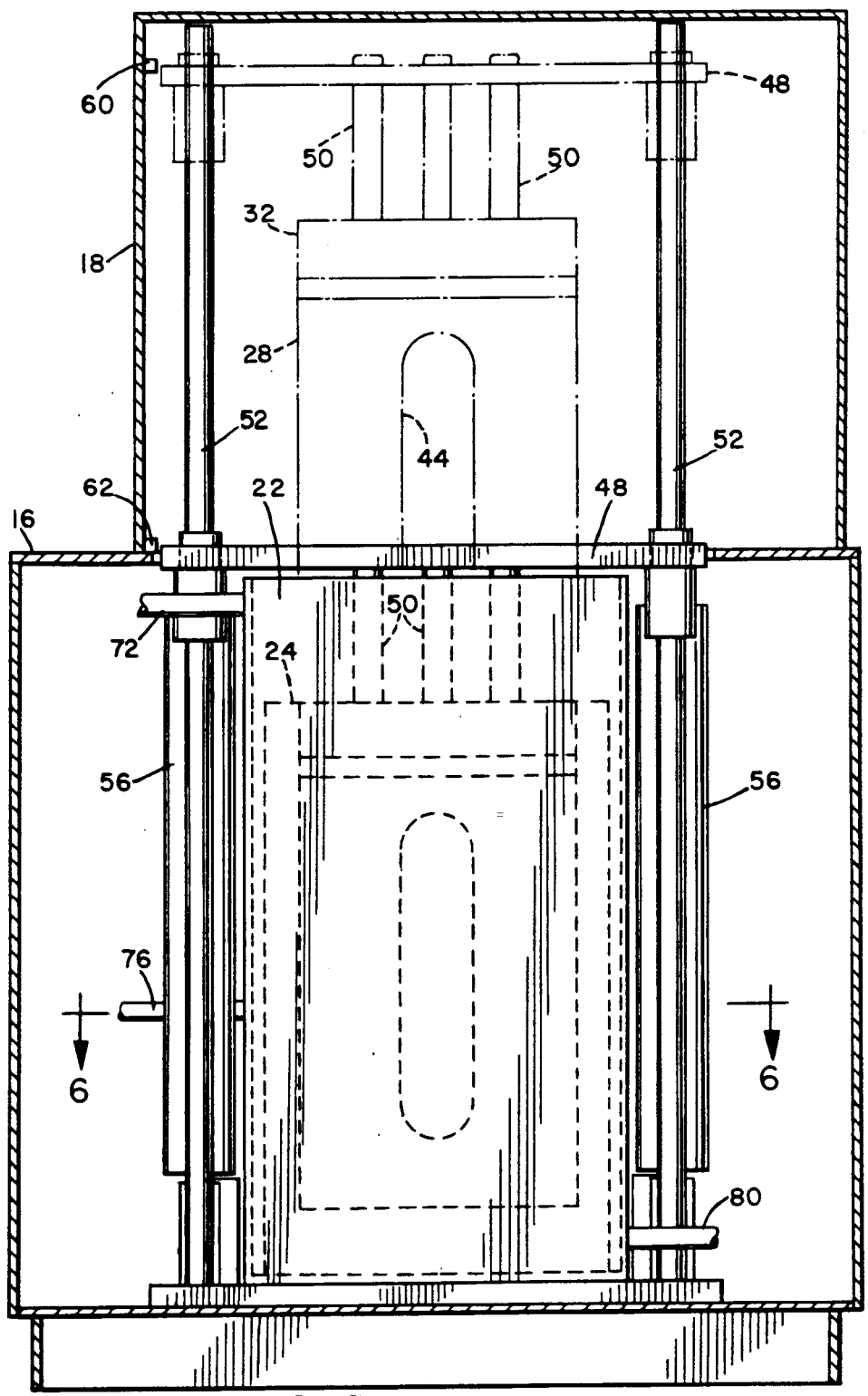
FIG. 3 is a rear elevational view with the cabinet panels removed.
Figure 5:
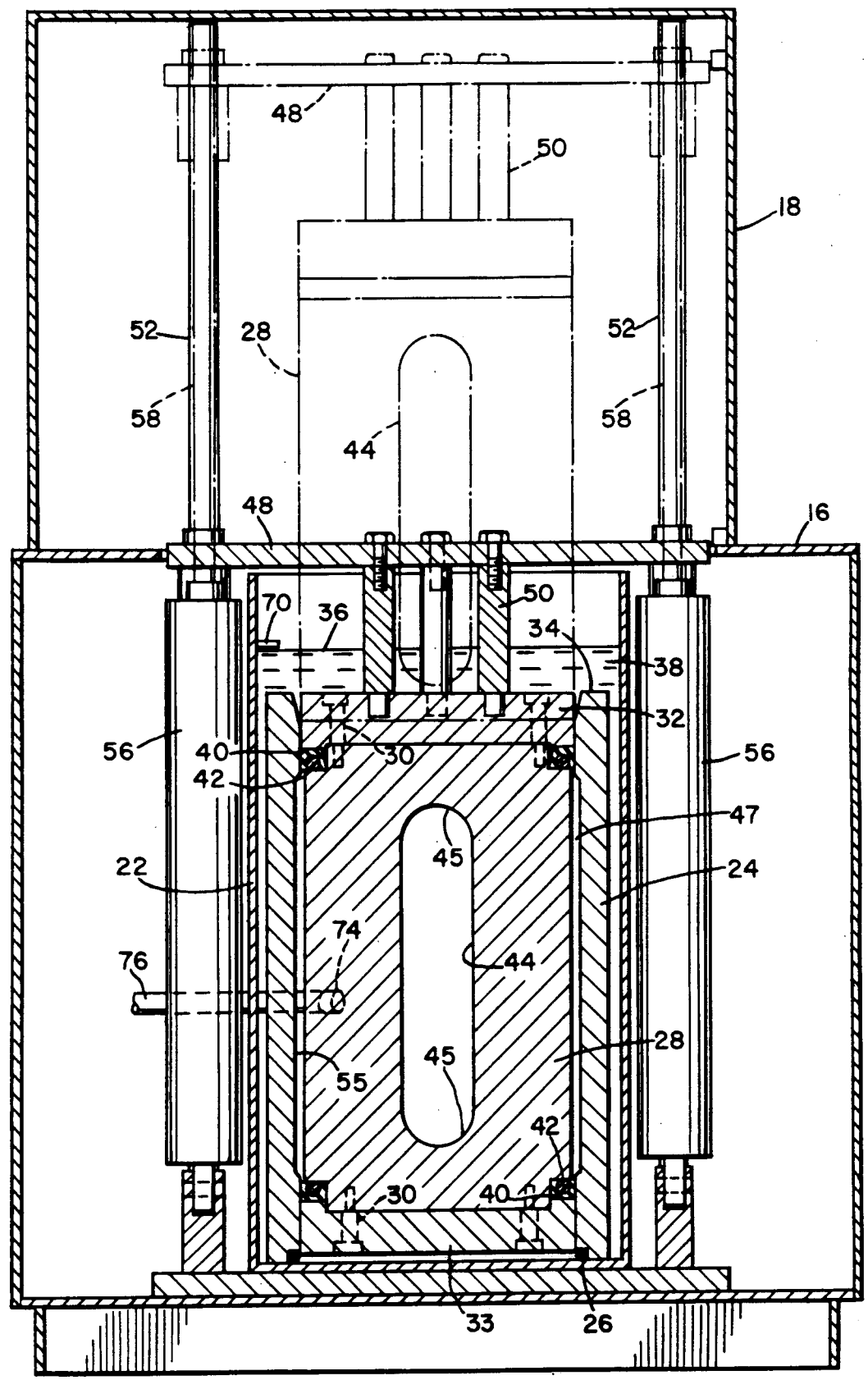
FIG. 5 is a vertical cross-section of the pressure chamber on the lines 5—5 of FIG. 2.
Figure 6:
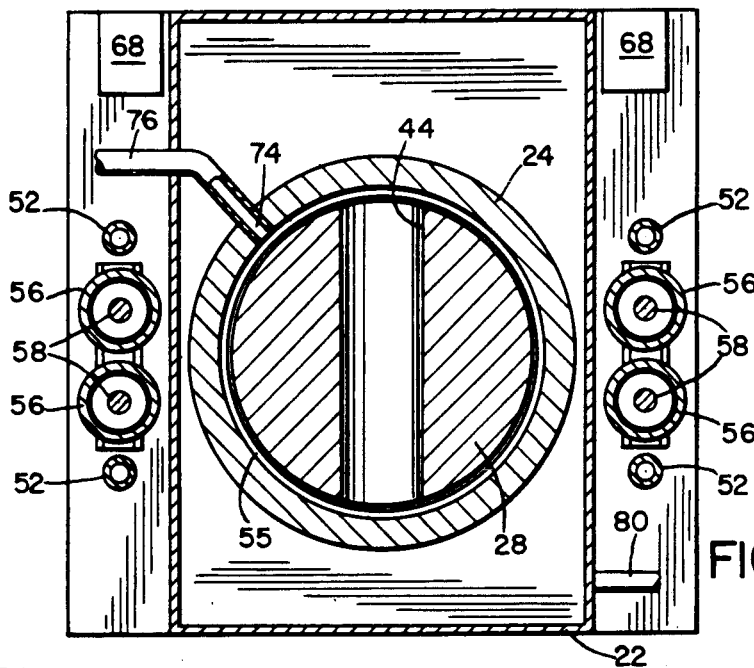
FIG. 6 is a section of the lines 6—6 of FIG. 5.

The interior of the cabinet is best illustrated in FIGS. 2 to 6. As illustrated in FIG. 3, 4, and 6, an outer reservoir 22 is located in the lower portion 16 of the outer housing. An inner, cylindrical pressure chamber 24 is mounted in the bottom of the reservoir 22 and is sealed at its lower end via "0" ring 26. A sliding plug member 28 substantially fills the interior of chamber 24 in the lowermost, operating position illustrated in solid outline in FIG. 5, and is secured at its opposite ends via a plurality of bolts 30 to upper and lower end caps 32, 33 which seal both ends of the chamber in the position illustrated in FIG. 5. When operating, the upper end 34 of pressure chamber 24 is located below the surface 36 of water or liquid 38 in reservoir 22. High pressure seals 40 are located between the ends of the plug member 28 and the end caps 32 and 33 to seal the interior of the chamber between the end caps. The seals 40 in the preferred embodiment of the invention are of wedge like cross section with their largest dimension end facing inwardly, and have grooves on their inner faces on which 0-ring seals 42 are located for improved sealing efficiency. Plug member 28 is of suitable high strength metal such as solid steel having a transverse through slot or cavity 44 which is preferably elongate as illustrated in FIG. 5 with rounded ends 45. The slot is aligned with the longitudinal axis of the plug member. The walls of chamber 24 are recessed or indented between the end caps to provide recessed area 55 surrounding the plug member both to allow the member 28 to slide up and down easily without damage to the lower seal, and also to permit pressurized liquid to fill the slot or pressurization cavity 44.

A lifting assembly 46 is secured via cross member 48 which extends across the top of the reservoir and connecting posts or bolts 50 to the upper end cap 32 for moving the end cap and plug member 28 between the lowermost, operating position illustrated in solid outline in FIG. 5 and the raised, open position illustrated in dotted outline in FIG. 5. The upper end of the reservoir is open to allow the plug member to be raised and lowered. Suitable vertical guide posts 52 extend between the top and bottom of housing 10 through openings 54 at the four corners of cross member 48 to guide the plug member for vertical sliding movement in alignment with the axis of pressure chamber 24. The lifting mechanism or assembly 46 comprises a series of four pneumatic piston and cylinder or ram devices 56 having pistons or lift rods 58 secured to the cross member 48, as best illustrated in FIG. 2. The guide posts and ram devices are located outside the reservoir on opposite sides of the pressure chamber, as best seen in FIG. 6. Suitable upper and lower proximity sensors 60,62 (see FIG. 3) are located on the inner wall of the housing 10 for sensing when the cross member 48 is in the uppermost position illustrated in dotted outline in FIG. 3 and the lowermost position illustrated in solid outline in FIG. 3. The pneumatic cylinders are connected to a suitable source of compressed air (not illustrated).

Other system sensors provided in the apparatus include a door proximity sensor 64 located in the door opening for detecting whether the door is fully closed, and a temperature sensor 66 located in the reservoir for measuring the water temperature. Any suitable type of proximity sensor may be used for sensor 60, 62 and 64, such as optical or magnetic switching devices responsive to suitable activators mounted on the lifting frame and door. Heaters 68 are provided for heating the water to a desired operating temperature. A suitable water level sensor may be located on the inner wall of the reservoir if desired for locating when the water falls below a predetermined level necessary for proper operation of the system. However, in the preferred embodiment illustrated, the water level is checked by observation, and a water input hose connection 72 allows water to be supplied to the reservoir when needed.

Pressure chamber 24 has an inlet opening 74 connected via a hose or pipeline 76 extending through the reservoir to a pump 78 (see FIG. 7) having an inlet connected via pipeline 80 to a reservoir outlet 82. A high pressure check valve 84 located in the high pressure line 76 between the pump and pressure chamber controls the pressure in chamber 24 and is connected to a suitable gauge or indicator on the front panel 12 for indicating the pressure.

Preferably, the machine can be operated as a complete laminating workstation and includes an integral vacuum and sealing station for sealing parts to be laminated in individual bags. The station includes a vacuum pump (not illustrated) having an outlet for vacuum sealing multi-layer parts or ceramic components to be laminated into plastic bags of a size and material suitable for the parts being laminated, along with an impulse heater or sealing arm for sealing the open end of the bag.

Figure 7:
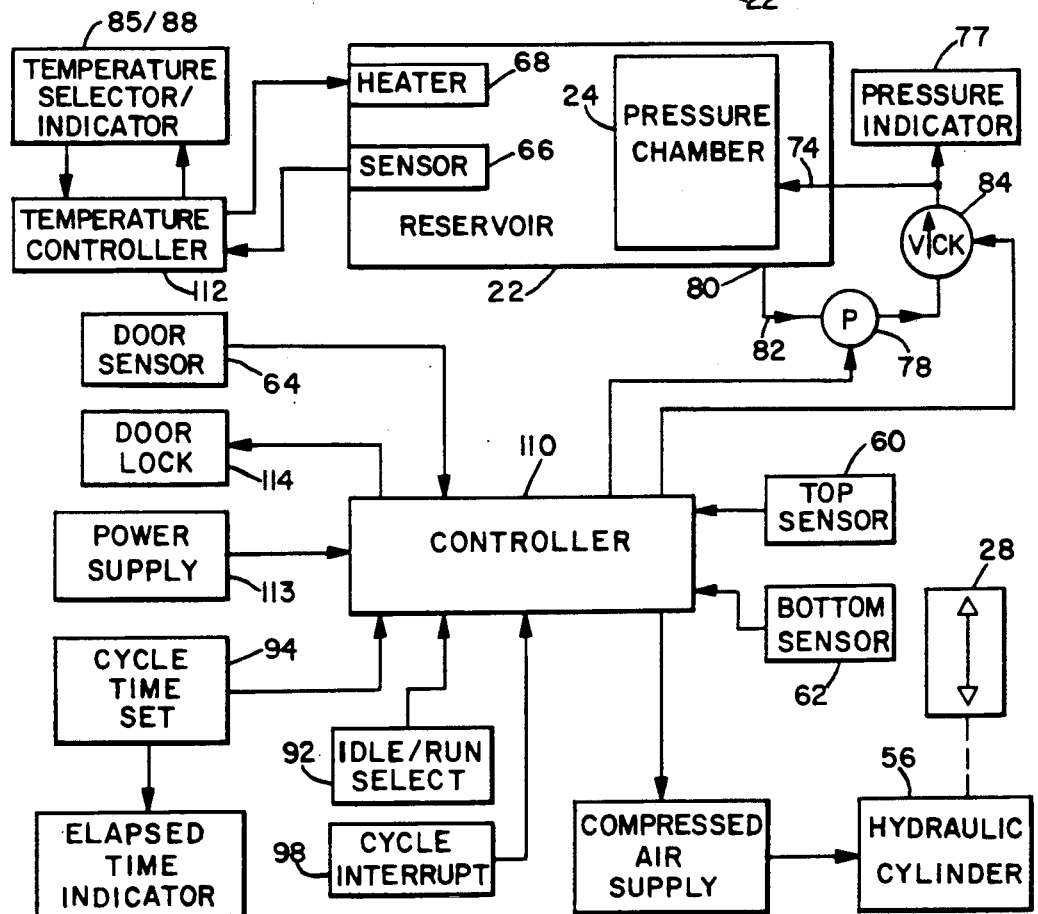
FIG. 7 is a block diagram illustrating the control system for operating the pressure chamber.

Operation of the system will now be described in more detail with reference to the control diagram of FIG. 7. The control panel on the front of the machine allows the operator to set a number of operation criteria, including water temperature and pressure, via control dials 85,86. The control panel also includes indicators 88, 77, 89 of the actual temperature, lamination pressure, and booster pressure. A main power switch 90 supplies on-line power to the temperature control heaters and liquid level controller, and enables the IDLE/RUN control switch 92. A cycle timer 94 allows the operator to control the length of a lamination cycle, and includes an indicator 95 showing the amount of time elapsed in any cycle. A cycle engaged indicator light 96 indicates to the operator that a lamination cycle is in progress. A cycle interrupt switch 98 is provided for emergency interruption of a lamination cycle.

The operating procedure for a typical lamination cycle will now be described in detail. Operation of &:he lamination process is controlled by a suitable programmable logic controller 110 which may consist of a suitably programmed microprocessor, for example. In the preferred embodiment of the invention, an off-the-shelf OMRON controller is used. This type of system controller is well known in the field and will not be described in any more detail here. Control of the operating temperature is achieved by a separate temperature controller 112 of a conventional type, which switches off heaters 68 when a selected temperature is reached, as detected by temperature sensor 66.

At the start of any lamination process, the operator will adjust the process parameters such as temperature, pressure and cycle time as necessary. In a typical example, a temperature of 80 degrees Centigrade, a pressure of 5000 p.s.i. and a cycle time of 5 minutes may be selected. The system allows temperature settings up to 80 degrees Centigrade, lamination pressure of up to 5000 p.s.i., and any desires cycle time from 0.1 seconds to 9900 hours. The operator then prepares one or more parts (depending on their dimensions) for lamination. The number of parts which can be laminated in any one cycle will be dependent on the dimensions of the parts and the dimensions of the cavity 44 in which they will be located during lamination. In one specific example the cavity dimensions were 12 inches by 14 inches by 3 inches. This allows products of maximum dimensions up to 12 inches by 12 inches to be laminated. For example, 12 3 inch by 3 inch parts could be laminated in a single cycle. The parts to be laminated will first be sealed by the operator into suitable size vacuum bags, and then loaded into the slot. If necessary, the operator will wait for the temperature to stabilize. In the normal inoperative or default condition, the plug member will be fully lowered and the access or safety door 20 will be latched. When the operator switches the power switch on, connecting the system to a suitable power supply 113 such as a main power input, the IDLE/RUN switch is enabled. The IDLE/RUN switch is then toggled into the RUN position. The controller then activates the lifting assembly to raise the plug member into the uppermost position with the slot 44 in alignment with the access door. When the upper proximity sensor indicates that the fully raised position has been reached, the door lock or latch 114 is released. The operator is now free to open the door and insert the loaded rack into the cavity or slot 44 in the raised plug member via access door 20. The operator then closes the access door and presses the CYCLE START button to initiate the lamination cycle. The controller initiates the lamination cycle only if the "door closed" sensor is engaged, indicating that the door is safely closed and door lock 114 is activated.

At this point the controller activates the pneumatic rams to retract the lift rods into the respective cylinders, simultaneously lowering the plug member into the pressure chamber. When the lower proximity sensor indicates that the plug member is at the bottom of its stroke, the controller activates the pressure booster pump 78 to pressurize the chamber to the selected pressure level and starts the cycle timer 94. The pressurized water or liquid in the chamber will compress the parts inside their vacuum sealed bags so that the layers will be evenly laminated. Because of the design of the pressure seals and the small area which is exposed to the water pressure in the recessed area 47, due to the design of the chamber and plug member, there is no need for a complicated clamping system to safely seal the pressure chamber. The plug member is retained in the chamber by equal opposing forces applied to end caps 32 and 33, without the need for any additional clamps. Instead of a relatively large end cap having pressurized liquid acting over its entire surface area (where force is equal to pressure times area), the pressurized liquid acts in opposite directions on the relatively small exposed area of the seals 40 secured at each end of the relatively massive and extremely strong plug member. Thus, the net force exerted on the plug in an outward direction will actually be negligible as compared to standard, end capped lamination chambers. Because of the equally opposing end forces the plug will remain in the retracted position with no clamping device. The pneumatic rams are a convenient way to lift the massive structure to the load position.

The design of the end seals is such that they will tend to spread out when pressure is applied to them, increasing the sealing effect. The rounded or radiused upper and lower ends of the lamination slot will also tend to spread the force relatively evenly in all directions, rather than having a force of 5000 p.s.i. times the surface area applied in one direction only, as was the case in previous lamination chambers where the total area of an end cap was exposed to the internal pressure of the chamber. This design in conjunction with the thick metal walls of the pressure chamber, and the thick, solid metal plug construction, will be sufficient to hold the apparatus safely under pressures up to 5000 p.s.i. without any need for complex clamping systems. The solid mass of the metal plug substantially filling the pressure chamber will take up the force and spread it so that the apparatus can safely withstand the applied internal pressure without blowing apart.

When the cycle timer runs down, the valve 84 is switched off to release the pressure in the chamber and a second, internal timer is started. At the same time an alarm is sounded to indicate to the operator that the cycle has ended. When the second, safety timer runs down, it is safe to open the chamber by raising the plug member. The pneumatic ram cylinders are then energized to raise the plug member into the load/unload position, and the door is unlatched. The operator can then open the door, remove the lamination rack, and take out the bags containing the laminated parts. The above steps are repeated until an entire batch of parts has been laminated.

The cycle can be interrupted at any time by pressing the CYCLE INTERRUPT button, which sends a reset signal to the timer. This also results in release of pressure in the pressure chamber, starting of the second timer, and subsequent raising of the plug member out of the chamber.

Since the pressure chamber is under water at all times, and lower end of the slot 44 is under water in the raised position, the slot will be filled with water before entering the chamber. There is therefore no need to purge air from the system at the end of each lamination cycle. This considerably reduces the time needed for the lamination process. Also, there are no complicated, heavy duty clamps to be released and re-latched between each lamination cycle as has previously been necessary in lamination chambers. This also considerably reduces the time needed, and therefore the expense of the process. The process is much faster, and higher volume, than previous isostatic lamination systems, and allows many parts (depending on their dimensions) to be laminated every cycle.

This system is reliable and efficient, and can be used in any process where workpieces are to be placed under pressure over a predetermined time period. It is particularly suitable for laminating multi-layer ceramic or plastic composite components as used in the electronics industry, and avoids the need for expensive dies. It allows pressure to be exerted evenly on all surfaces of the part at the same time, reducing the risk of delamination and registration shifts. Because the vacuum sealed bag containing the part conforms to its major contours, interior cavities of the part will be well laminated.

Although a preferred embodiment of the invention has been described above by way of example only, it will be understood by those skilled in the field that modifications may be made to the disclosed embodiment without departing from the scope of the invention, which is defined by the appended claims.

We claim:

1. A pressure chamber apparatus, comprising:
   a pressure chamber having an opening at one end;
   a plug member telescopically mounted in said chamber for sliding movement between a retracted position in which it is inside said chamber and an extended position in which it projects at least partially through said chamber opening, said plug member substantially filling said chamber in said retracted position and having a transverse through slot for containing one or more workpieces to be placed under pressure;
   drive means for moving said plug member back and forth between said retracted and extended positions;
   liquid supply means for supplying liquid to said pressure chamber;
   seal means for sealing said chamber when said plug member is in said retracted position; and
   pressure booster means for pressurizing liquid in said pressure chamber to a predetermined level.

2. The apparatus as claimed in claim 1, including an outer reservoir, said pressure chamber being located in said reservoir, said reservoir comprising means for containing a supply of liquid to a level above the open end of said pressure chamber.

3. The apparatus as claimed in claim 2, including heater means in said reservoir and temperature control means for controlling said heater means to heat said liquid to a predetermined temperature.

4. The apparatus as claimed in claim 2, including connecting pipe means connecting the supply of liquid in said reservoir to said pressure chamber, said pressure booster means comprising a pump in said pipe means for pumping liquid from said reservoir to said pressure chamber, and valve means for monitoring and controlling the pressure of liquid in said chamber.

5. The apparatus as claimed in claim 1, wherein said chamber and said plug member are both generally cylindrical in shape, and said chamber has an internal diameter along at least part of its length which is slightly larger than the outer diameter of said plug member to allow said plug member to slide freely into and out of said chamber.

6. The apparatus as claimed in claim 1, including detector means for detecting when said plug member is in said retracted and extended positions, and controller means for controlling operation of said pressure booster means in response to detection of said plug member in said retracted position.

7. The apparatus as claimed in claim 1, including two end caps and securing means for securing said end caps to opposite ends of said plug member, said seal means being located between each end cap and the respective end of said plug member.

8. The apparatus as claimed in claim 7, wherein said seal means at both ends of said plug comprises an annular seal member of tapered cross-section with its largest dimension end facing inwardly.

9. The apparatus as claimed in claim 1, wherein said slot is an elongate slot with its longitudinal axis aligned with the longitidunal axis of said chamber.

10. The apparatus as claimed in claim 9, wherein said slot has radiused ends.

11. A method of applying pressure to one or more workpieces, comprising the steps of:
    inserting one or more workpieces into a transverse through slot in a plug member located in an extended position projecting at least partially out of a pressure chamber in which it is telescopically mounted;
    retracting the plug member into the pressure chamber so that it substantially fills and completely seals the chamber;
    filling the area of the chamber surrounding the plug member and the slot in the plug member with liquid and pressurizing the liquid to a predetermined pressure;
    releasing the pressure after a predetermined time interval;
    moving the pressure member out of the pressure chamber into the extended position allowing access to the workpieces; and
    removing the workpieces from the slot.

* * * * *